US 6,652,705 B1

(12) United States Patent
Freuler et al.

(10) Patent No.: US 6,652,705 B1
(45) Date of Patent: Nov. 25, 2003

(54) GRAPHITIC ALLOTROPE INTERFACE COMPOSITION AND METHOD OF FABRICATING THE SAME

(75) Inventors: Raymond G. Freuler, Laguna Hills, CA (US); Gary E. Flynn, Coto de Caza, CA (US); Robert A. Rauch, Lake Forest, CA (US)

(73) Assignee: Power Devices, Inc., Laguna Hills, CA (US)

( * ) Notice: Subject to any disclaimer, the term of this patent is extended or adjusted under 35 U.S.C. 154(b) by 0 days.

(21) Appl. No.: 09/573,508

(22) Filed: May 18, 2000

(51) Int. Cl.⁷ .............................. B32B 31/00; C08K 5/01
(52) U.S. Cl. .................... 156/326; 252/74; 106/272; 524/489
(58) Field of Search ......................... 156/326; 252/74; 106/272; 427/11; 524/489; 438/122; 257/706, 712, 717

(56) References Cited

U.S. PATENT DOCUMENTS

| | | |
|---|---|---|
| 2,799,793 A | 7/1957 | De Cain |
| 2,887,628 A | 5/1959 | Zierdt, Jr. |
| 3,013,104 A | 12/1961 | Young |
| 3,249,680 A | 5/1966 | Sheets et al. |
| 3,353,974 A | * 11/1967 | Trimble et al. ............. 106/272 |
| 3,356,828 A | 12/1967 | Furness |
| 3,391,242 A | 7/1968 | Sudges |
| 3,463,140 A | 8/1969 | Rollor, Jr. |
| 3,463,161 A | 8/1969 | Andrassy |
| 3,467,547 A | 9/1969 | Harvey et al. |
| 3,476,177 A | 11/1969 | Potzl |
| 3,586,102 A | 6/1971 | Gilles |
| 3,603,106 A | 9/1971 | Ryan |
| 3,819,530 A | 6/1974 | Ratledge et al. |
| 3,823,089 A | 7/1974 | Ryan et al. |
| 3,887,628 A | 6/1975 | Beckers |
| 3,972,821 A | 8/1976 | Weidenbenner et al. |

(List continued on next page.)

FOREIGN PATENT DOCUMENTS

| | | | |
|---|---|---|---|
| CA | 600823 | 6/1960 | |
| CH | 660018 | * 3/1984 | ................ 252/74 |
| FR | 2368529 | 10/1976 | |
| GB | 1086003 | 10/1967 | |

OTHER PUBLICATIONS

Condensed Chemical Dictionary (CCD) Excerpt, © 1977, p. 650.*

(List continued on next page.)

Primary Examiner—Michael W. Ball
Assistant Examiner—John T. Haran
(74) Attorney, Agent, or Firm—Stetina Brunda Garred & Brucker

(57) ABSTRACT

An improved, more durable heat conductive composition for transferring heat from a heat-dissipating component to a heat dissipater and method of producing the same. The composition preferably comprises a base consisting of paraffin having particles of graphite suspended therein. In the preferred embodiment, the composition further includes a polymer to increase durability. The composition is formulated to be solid in the range of normal room temperatures, but liquify once subjected to temperatures just below the range at which heat generating electronic semi conductor devices typically operate. The present invention further comprises processes for transferring heat from a heat-dissipating component to a heat dissipater, which comprises applying the heat conductive composition to an interface between a heat-dissipating component and a heat sink. The compositions and methods of the present invention provide a highly efficient heat transfer which correspondingly produces system economic advantages and component liability enhancement.

10 Claims, 1 Drawing Sheet

U.S. PATENT DOCUMENTS

| | | | |
|---|---|---|---|
| 4,065,908 A | | 1/1978 | Mueller |
| 4,139,051 A | | 2/1979 | Jones et al. |
| 4,151,547 A | | 4/1979 | Rhoades et al. |
| 4,237,086 A | | 12/1980 | Gehle |
| 4,266,267 A | | 5/1981 | Ruegg |
| 4,299,715 A | * | 11/1981 | Whitfield et al. ............. 252/74 |
| 4,466,483 A | | 8/1984 | Whitfield et al. |
| 4,473,113 A | | 9/1984 | Whitfield et al. |
| 4,489,487 A | | 12/1984 | Bura |
| 5,060,114 A | | 10/1991 | Feinberg et al. |
| 5,237,086 A | | 8/1993 | Kruger et al. |
| 5,709,740 A | * | 1/1998 | Haider et al. ............... 106/272 |
| 5,904,796 A | | 5/1999 | Freuler et al. |
| 5,912,805 A | | 6/1999 | Freuler et al. |
| 5,931,831 A | | 8/1999 | Linder |
| 5,986,884 A | | 11/1999 | Jairazbhoy et al. |
| 6,054,198 A | * | 4/2000 | Bunyan et al. ............... 252/74 |

OTHER PUBLICATIONS

Power Devices, Inc.: "Kapton MT Substrate Coated with High Performance Thermal Compound in Easy–to–Use Form";MCM–Strate; 1996.

Power Devices, Inc.; "Low Thermal Resistance and Excellent Electrical Insulation in One Clean, Reliable System"; Isostrate.

Power Devices, Inc.; Adhesive–backed Aluminum Substrate with High Performance Thermal Compound in Easy–to–Use Form; MCM–Strate; 1996.

Power Devices, Inc.; The Cost–Effective Solution to Thermal Interface Problems–Clean, Dry and Easy to Use; Thermstrate.

Chomerics; "Thermattach 404 and 405 Thermally Conductive Adhesive Tapes"; Cho–Therm Thermal Interface Materials; Technical Bulletin 72; 1993.

Chomerics; "Thermattach T413 and T414 Thermally Conductive Adhesive Tapes"; Preliminary Product Data Sheet; 1994.

Chomerics; "Thermflow T705 and T710 Low Thermal Resistance Interface Pads", Cho–Therm Thermal Interface Material; Technical Bulletin 77; 1997.

The Bergquist Company; "SIL–PAD Design Guide"; Spring 1993.

* cited by examiner

GRAPHITIC ALLOTROPE INTERFACE COMPOSITION AND METHOD OF FABRICATING THE SAME

BACKGROUND OF THE INVENTION

Methods and materials for transferring heat at the interface between a heat-dissipating component, which typically includes various electronic components in semi-conductor devices, to an external heat dissipator or heat sink are well-known in the art. In this regard, such electronic components generate sufficient heat to adversely affect their operation unless adequate heat dissipation is provided.

According to contemporary methodology, the typical solution to such heat dissipation problems is to provide an external heat dissipator or heat sink coupled to the electronic device. Such heat sink ideally provides a heat-conductive pathway from the heat dissipating component to structures such as fins or other protuberances having sufficient surface area to dissipate the heat into the surrounding air. To facilitate such heat dissipation, a fan is frequently utilized to provide adequate air circulation over the fins or protuberances.

However, essential to any effective system for removing heat from an electronic component to a heat sink requires efficient and uniform heat transfer at the interface between the component and the heat sink. Among the more efficient means by which heat is transferred across the interface between the component and the heat sink has been the use of heat conductive pads. Such heat conductive pads are typically pre-formed to have a shape or footprint compatible with a particular electronic component and/or heat sink, such that a given pad may be easily applied thereto prior to coupling the heat sink to the electronic component.

Exemplary of such contemporary pad-type thermal interfaces are THERMSTRATE and ISOSTRATE (both registered trademarks of Power Devices, Inc. of Laguna Hills, Calif.). The THERMSTRATE interface comprises thermally conductive, die-cut pads which are placed intermediate the electronic component and the heat sink so as to enhance heat conduction there between. The THERMSTRATE heat pads comprise a durable-type 1100 or 1145 aluminum alloy substrate having a thickness of approximately 0.002 inch (although other aluminum and/or copper foil thickness may be utilized) that is coated on both sides thereof with a proprietary thermal compound, the latter comprising a paraffin base containing additives which enhance thermal conductivity, as well as control its responsiveness to heat and pressure. Such compound advantageously undergoes a selective phase change insofar as the compound is dry at room temperature, yet liquefies just below the operating temperature of the great majority of electronic components, which is typically around 50° C. or higher, so as to assure desired heat conduction. When the electronic component is no longer in use (i.e., is no longer dissipating heat), such thermally conductive compound resolidifies once the same cools to room temperature.

The ISOSTRATE thermal interface is likewise a die-cut mounting pad and utilizes a heat conducting polyamide substrate, namely, KAPTON (a registered trademark of DuPont) type MT. The ISOSTRATE thermal interface likewise is a proprietary paraffin-based thermal compound utilizing additives to enhance thermal conductivity and to control its response to heat and pressure.

The process for forming thermal interfaces according to contemporary methodology is described in more detail in U.S. Pat. No. 4,299,715, issued on Nov. 10, 1981 to Whitfield et al. and entitled a METHODS AND MATERIALS FOR CONDUCTING HEAT FROM ELECTRONIC COMPONENTS AND THE LIKE; U.S. Pat. No. 4,466,483, issued on Aug. 21, 1984 to Whitfield et al. and entitled METHODS AND MEANS FOR CONDUCTING HEAT FROM ELECTRONIC COMPONENTS AND THE LIKE; and U.S. Pat. No. 4,473,113, issued on Sep. 25, 1984 to Whitfield et al., and entitled METHODS AND MATERIALS FOR CONDUCTING HEAT FROM ELECTRONIC COMPONENTS AND THE LIKE, the contents of all three of which are expressly incorporated herein by reference.

As is well-known in the art, by providing a thermally conductive compound that is formulated to have selective phase change properties (i.e., having a melting point such that the compound is solid at room temperature, but liquefies at or below the operating temperature of the electronic component to which it is coupled) advantageously enables the compound to be easily used and handled when applied to the interface between the component and a given heat sink. On the other hand, by assuming a liquid state when exposed to the operating temperature of the electronic component, such thermally conductive composition advantageously is then able to fill the voids created by air gaps at the interface between the electronic component and the heat sink. Once filled, such gaps no longer impose an impediment to efficient heat transfer. As those skilled in the art will appreciate, heat flow across the interface improves substantially with better mechanical contact between the electronic component and the heat sink.

Despite their general effectiveness at transferring heat, however, many thermally conductive compounds currently in use have the drawback of migrating, or shifting away from the interface surfaces upon which they are intended to be applied. In this regard, phase change thermal interface materials tend to be very sensitive materials that can be easily ablated as such materials are handled in manufacturing and shipping processes. Specifically, due to the generally wax-like nature of such thermal interface materials, such materials are inherently susceptible to deformation and mis-shaping even when subjected to minimal handling. As a consequence, such thermal compounds, once ablated or mis-shapen, become substantially compromised as to its ability to transfer heat across an interface. Specifically, such deformation can cause air gaps or voids to form at the thermal interface, which, as a heat conductive medium, is inefficient.

As such, as opposed to being deployed at the time of manufacturer, as would be optimal to minimize expense and expedite manufacturing, such materials must be applied at a later time, typically on-site by the end user. Such processes are well-known in the art to not only be labor intensive, but also messy and difficult to handle. The latter factor is exceptionally problematic insofar as the same often results in an excessive loss of product, particularly with respect to thermal grease and other prior art compositions.

Accordingly, there is a need in the art for a thermally conductive compound for transferring heat from a heat-dissipating component to a heat sink that is more rugged and durable than prior art composition. There is additionally a need in the art for a thermally conductive interface compound that can be readily deployed in remote manufacturing processes and thereafter withstand the abuse and mishandling typically encountered during shipment. There is further a need for such a compound that is effective in filling the voids between and transferring heat away from a given heat-dissipating component to a heat sink and is likewise easy to handle and apply, and preferably formulated to assume a selective phase change whereby the compound is in a solid state at room temperature, but liquefies when subjected to higher temperatures just below the temperatures at which electronic devices typically operate. There is still further a need in the art for a thermally conductive interface compound that is of simple formulation, easy to produce, may be designed to have desirable viscous and sag resistant properties, and does not require special handling.

SUMMARY OF THE INVENTION

The present invention specifically addresses and alleviates the aforementioned deficiencies in the art. In this regard, the present invention is directed to a thermally conductive compound for facilitating the transfer of heat from a heat dissipating component to a heat sink that, in addition to effectively conducting heat, is substantially more durable and rugged than prior art compositions. In the preferred embodiment, the composition comprises a base of paraffin or, optionally, a blend of paraffin and petrolatum having quantities of graphite particles suspended therewith. The blend of paraffin and petrolatum is preferably formed such that the ratio of paraffin to petrolatum by percent weight ranges between 1.0:0 to 3.0. The graphite particles are preferably present in amounts between 10% by 40% by weight, with 35% being most preferred. The particles are further preferably formed to have generally spherical shapes having a diameter equal to or less than 6 microns. Additional components may be added to the thermal composition of the present invention, for example, a synthetic polymer to impart greater durability. Although not preferred, there may further be provided a thinning agent, such as a polyalphaolefin. Other surfactant materials are also contemplated. In all embodiments though, the composition is preferably formed to have selective phase change properties whereby the composite exists in a solid phase at normal room temperature, but melts, and therefore assumes a liquid phase, when subjected to an elevated temperature, typically at or above 50° C., temperatures which are below the levels heat-dissipating electronic components usually operate.

The present invention further comprises a process for formulating the thermally conductive composition of the present invention comprising the steps of melting the paraffin (or blending the paraffin and petrolatum) to form a first admixture, followed by adding a polymer to increase the durability of the composition. Thereafter, a first portion of the graphite particles, which preferably comprises 60%±10% of the total final weight of graphite, is then added to such admixture followed by adding a thinning agent, such as a polyalphaolefin. Thereafter, the second remaining portion of the graphite, which preferably comprises 40%±10% of the total graphite weight, is then added, with the resultant admixture then being sufficiently mixed until the entire portion of graphite particles becomes sufficiently dispersed and suspended therewithin. Optionally, although not preferred, a viscosity-enhancing agent, which preferably comprises fumed silica, may then added and thoroughly mixed therein to form the resultant composition. Such resultant composition may then be applied to thermal interfaces as would conventional thermally conductive compounds. In this regard, the composition of the present invention may be directly excoriated upon the interface surface or may be applied to the respective interface surfaces via a conventional coating rods, whether wire wound or roll formed. Alternatively, it is contemplated that the composition may also be melted down and dispensed or sprayed upon the interface surfaces between a heat-dissipating component and a heat sink.

It is therefore an object of the present invention to provide a thermally conductive interface composition that substantially more rugged and durable than prior art compositions, and may be further formulated to have a desired viscosity and sag resistance.

Another object of the present invention is to provide a thermally conductive interface composition that can withstand abuse in shipment and handling that is likewise exceptionally effective in conducting heat from a heat-dissipating component, such as an electronic element, to a heat sink to thus increase the reliability and life of the component.

Another object of the present invention is to provide a thermally conductive interface composition that can be readily deployed in remote manufacturing processes, as oppose to prior art compositions requiring post-shipment, on-site application.

Another object of the present invention is to provide a thermally conductive interface composition that is capable of providing a highly efficient heat transfer medium, which offers economic advantages for options of eliminating costly heat-dispensing mechanism, such as fans, or toward reduction in the size, weight, and cost of heat sinks.

Another object of the present invention is to provide a thermally conductive interface composition that is clean and easy to use, and further, may be used in solid form, or which is in solid form when used, but which will become fluid when performing its function at elevated temperatures.

Another object of the present invention is to provide a thermally conductive interface composition that is of simple formulation and may be readily made from commercially available materials.

A still further object of the present invention is to provide a process for forming the novel thermally conductive interface composition of the present invention, as well as utilizing the same to transfer heat from a heat-dissipating component to a heat sink.

BRIEF DESCRIPTION OF THE DRAWINGS

These, as well as other features of the present invention, will become more apparent upon reference to the drawings, wherein.

DETAILED DESCRIPTION OF THE PREFERRED EMBODIMENT

Figure 1:
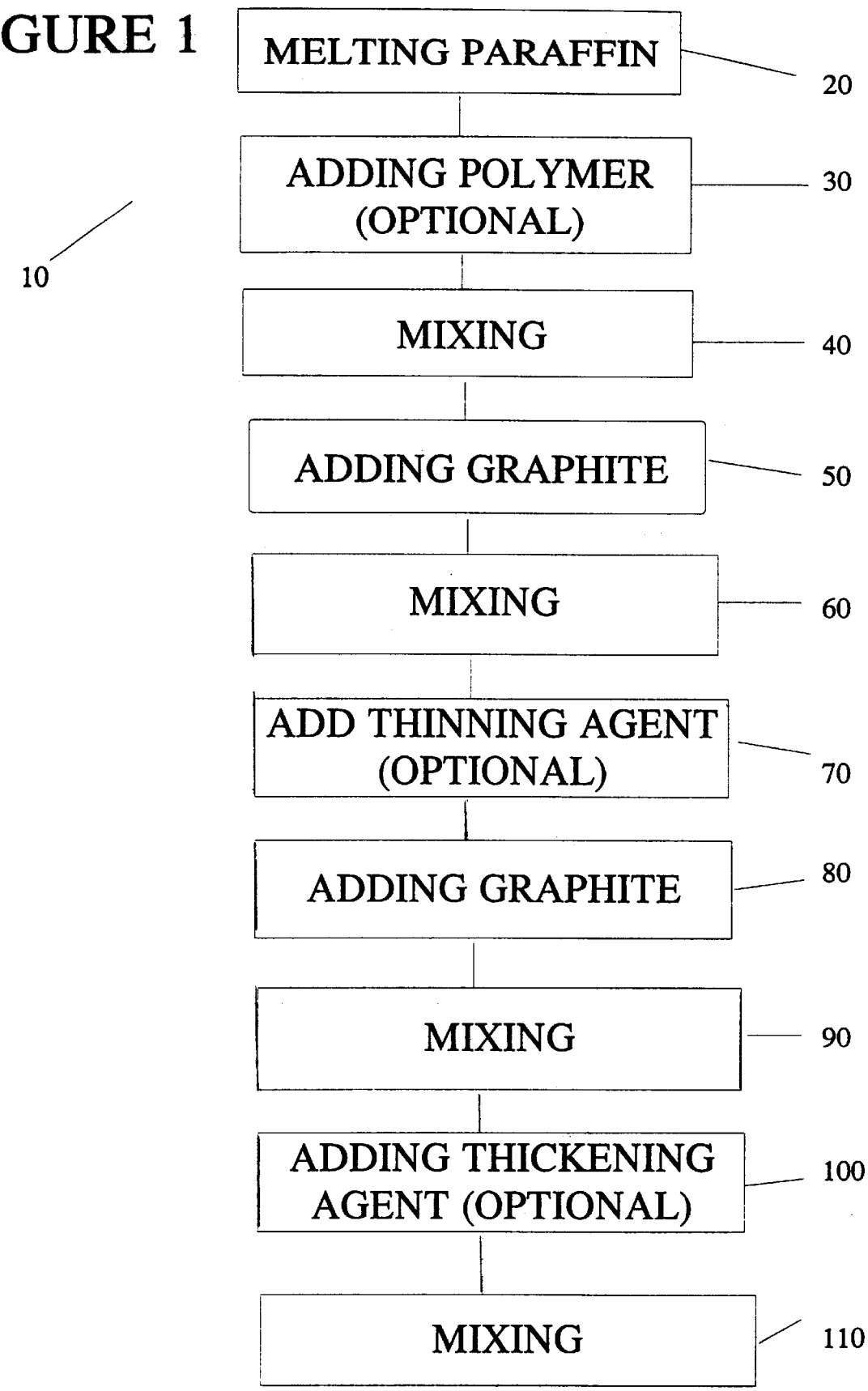
FIG. 1 schematically depicts the steps utilized in producing the heat conductive compound according to a preferred process of the present invention.

The detailed description set forth below in connection with the appended drawings is intended merely as a description of the presently preferred embodiment of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

The composition of the present invention comprises a wax-like, thermally conductive interface compound whose purpose is to complete a thermally conductive path from a heated element to a heat sink, that is exceptionally more durable, and possess better re-flow properties than prior art compositions. In this regard, the use of heat conducting materials to transfer heat from a heated element, such as a semi-conductor or other electronic component, to a heat dissipater or heat sink is well known in the art, and is necessary insofar as such heated element requires that the heat given off by such component be drawn away therefrom. Otherwise, substantial, if not permanent damage, can be experienced by the electronic component via the phenomenon known in the art as thermal runaway.

While thermally conductive interface compositions of the prior art are effective at transferring heat away from the heat dissipating component to a heat sink coupled therewith, virtually all prior art compositions have the drawback of being easily deformed or misshapen once applied to an interface. In this regard, such prior art compositions, which are typically formed from grease or wax-like materials, can ablate or scar when subjected to minimal contact. Such materials can further become deformed when subjected to elevated temperatures. Such deformation is especially likely during shipment where vigorous handling frequently occurs, as well as through extreme environmental temperature fluctuations.

The thermally conductive interface compounds of the present invention, by contrast, are specifically designed and formulated to have substantially greater durability than such prior art compounds. Such properties enable such novel compounds to be utilized in remote manufacturing processes of electronic components which can then be shipped without incurring substantial added labor costs.

The basic two (2) components that comprise this invention, and the respective percentages, by weight thereof, encompass the following ranges:

TABLE 1

| COMPONENTS | PERCENT BY WEIGHT |
| --- | --- |
| Paraffin | 60% to 90% |
| Graphite | 10% to 40% |

It is understood that the percentages of the two (2) components above will total 100% by weight. If other materials are included in the formulation, the percentages of all ingredients will still total 100% by weight.

The graphite component preferably comprises high grade commercial graphite powder. The graphite exists as particles preferably comprises spherical particles having a diameter ranging typically less than 6 microns. Additionally, in a more highly preferred embodiment, the graphite component is present in amount of approximately 35% by weight. Among the types of commercially available graphite powder suitable for practice of the present invention include KS-6, produced by Timcal America, Inc. of Westlake, Ohio.

The paraffin component of the composition of the present invention may be of standard commercial grade for use in a wide range of commercial applications. Preferably, the paraffin component comprises 51° C. paraffin wax which, as will be known to those skilled in the art, constitutes a grade of paraffin having a specific melting point (i.e., 51° C.). By utilizing 51° C. paraffin wax, the resulting composition will have a melting point of approximately 50° to 61° C., which will thus correspond to the temperature at which the composition transitions from its solid phase to its molten, liquid phase.

Advantageously, such melting point is selected to be below the temperature at which most electronic components operate. In this regard, such thermal composition will only assume the liquid state during the operation of the electronic component, and only during such time as the component operates at such elevated temperatures. As a result, interface surface wetting action is achieved and heat transfer efficiency for the component is enhanced forevermore of the life of the component across its full operating temperature range.

Although the compositions of the present invention preferably utilize paraffin exclusively as the base compound, petrolatum may additionally be blended with the paraffin to thus form a resultant base compound having a desired hardness or softness, as may be advantageous for a given application. Preferably, the paraffin and petrolatum components will be blended together such that the ratio of such components (i.e., paraffin to petrolatum) is between approximately 1.0:0 to 3.0:1 by percent weight. In this regard, as the petrolatum component is increased relative the paraffin component, the resultant composition will correspondingly be caused to increase in softness.

As will be appreciated, in any formulation the compositions of the present invention will have the desired phase change property of remaining in a solid phase while in the range of normal room temperature, and as the temperature rises become plastic, and thereafter become molten at higher temperatures, as will be encountered by the composition when applied to the interface between the heat-dissipating component and a heat sink. In this respect, by assuming a liquid state during operation of the electric component, the thermally conductive composition of the present invention will be able to fill those voids or air gaps existing at the interface between the component and the heat sink and will thus provide for better contact, and thus better heat conduction versus the condition of poor heat conduction if such voids or gaps were not otherwise filled. It will additionally be recognized, however, that although paraffin, and to a lesser extent a mixture of paraffin and petrolatum, are discussed as preferred components of the composition of the present invention, numerous other natural or synthetic materials, for example, waxes or fats, may be suitable for the present invention. Representative of such suitable materials include, but are by no means limited to, beeswax, palm wax, mineral waxes, and/or glycerin, either alone or in combination. It should further be recognized that certain vegetable oils may also serve as a component of the thermally conductive composition of the present invention.

With respect to the aforementioned composition, the same may be prepared according to the schematic flow diagram of FIG. 1. The process 10 of formulating the compositions of the present invention comprises the initial step 20 of adding the paraffin and petrolatum components in a ratio of between approximately 1.0:0 to 3.0:1 by percent weight and melting the same until a first admixture of blended paraffin and petrolatum is formed. In order to impart greater durability and ruggedness to the composition, as is typically desired when taking into account manufacturing and shipping considerations for electronic devices, there may be added in step 30 a plastic, or polymer material, and in particular a synthetic resinous plastic material such as ELVAX, a registered trademark of E.I. DU PONT DE NEMOURS & COMPANY of Wilmington, Del. Such synthetic plastic material may be present in an amount of up to 5% of the weight of the final composition. According to a more highly preferred embodiment, such plastic material, namely, an ethylene vinyl acetate copolymer or terpolymer resin may be present in an amount of approximately 2% by weight. Such material is then blended with the first admixture to form a second admixture.

Following mixing step 40, a first portion of the graphite, which preferably comprises 60%±10% of the total weight of graphite to be added to the composition, is added in a fourth step 50, and thereafter thoroughly mixed in step 60 to thus form a third admixture. As it will appreciated, the thermal compound for the present invention will achieve optimal migration resistant properties when the particles of graphite are as thoroughly dispersed within the paraffin/petrolatum base as possible such that the surface area thereof is maximized.

The thinning agent, which preferably comprises a polyalphaolefin such as Vybar 103 produced by Baker Petrolite, may then be optionally added to the composition in step 70 and then thoroughly mixed therein to thus produce a fourth admixture. As will be appreciated by those skilled in the art, the thinning agent facilitates the ability of the particulate graphite to be thoroughly mixed within the paraffin/petrolatum base of the thermal compound of the present invention. The addition of up to 2% by weight of Vybar 103 is considered optimal in the practice of the present invention insofar as the same correspondingly allows the solid contents to be easily incorporated into the paraffin/petrolatum base of the present invention. While Vybar 103 is a particularly well-suited thinning agent for practice of the present invention, particularly in light of its being a highly branch polyalphaolefin, it will be recognized by those skilled in the art that other thinning agents, or surfactant materials agents, or surfactant materials may be utilized in the practice of the present invention.

Once such fourth admixture is attained, the remaining portion of graphite, which preferably comprises the remaining 40%±10% of the total graphite weight, is then added in step 80 and thoroughly mixed therein via step 90 to thus produce a resultant fifth admixture. While it is contemplated that all of the graphite may be added to the second admixture, due to the substantial viscosity that is immediately produced upon introduction of the entire amount of graphite, coupled with the substantial increase in mixing time necessary to thoroughly disperse such graphite particles throughout the admixture, it is presently believed that a multi-step introduction of the graphite is preferred.

The resultant fifth admixture, is suitable for use as a thermally conductive compound for transferring heat from a heat-dissipating component to a heat sink. Although not preferred, a thickening composition may optionally be added in step 100 and mixed therein in step 110 to increase the sag resistance of the thermal composition to thus impart viscosity build-up and flow control properties that may be desired for a given application. One preferred agent includes fumed silica, and in particular Cab-O-Sil-5 produced by Cabot Corporation, Inc. of Boston, Mass., which may be preferably added to the composition in an amount up to approximately 5.0% by weight of the total composition to achieve a sufficiently high degree of sag resistance for most interface applications. Preferably, the thermal compositions of the present invention will be formulated such that the same have a viscosity of 42 SUS, which corresponds to the Sibilate Universal Scale viscosity index commonly utilized in the United States.

The thermally conductive compositions of the present invention may be applied to a given interface surface via conventional coating rods. Such coating rods, known in the art as "metering rods" or "wet film applicator rods" are particularly effective in producing coatings having uniform thicknesses about the surfaces to which they are applied. Alternatively, it is contemplated that the composition of the present invention may be melted and thereafter be possibly sprayed directly or dispensed onto the surfaces to be interfaced with one another. As will be appreciated by those skilled in the art, in order to so apply the compositions of the present invention, such receiving services typically must be heated to a temperature close to or above the temperature at which the composition transitions to its liquid phase. The composition may also be directly applied onto interface pads, and the like. For most applications, it has been found that a single coating having a thickness of 0.5 to 1 mil will exhibit excellent thermally conductive properties that further show no migration down vertically-oriented thermal interfaces at temperatures of 215° F.

Once so applied, the composition of the present invention will perform in a manner substantially similar to, or more effective than, prior art thermally conductive compositions. In this regard, the composition of the present invention will remain solid at normal room temperatures, but assume a liquid phase when heated to temperatures at or over 51° C., which is typically just below of the temperatures at which electronic components operate. The composition of the present invention has been shown to increase the reliability and life of the electronic components from 50% to 100% for every 5° to 10° C. decrease in the operating temperature of such given electronic components. This feature advantageously translates directly into providing optimal electronic component operation. Moreover, the greater efficiency by which heat is transferred via the composition of the present invention enables costs to be minimized with respect to heat dissipating componentry. In this regard, by providing a highly efficient heat transfer medium, there is thus eliminated costly fans, or alternatively, irreduction in the size, weight and cost of heat sinks necessary to effectively dissipate heat generated from the electronic componentry.

Advantageously, however, the composition of the present invention will further resist migration away from the interface surfaces to which it is applied. Moreover, such compositions, when formulated in the aforementioned manner, are very durable and have a hard finish in the solid phase. Such properties are desirable insofar as such durable hard finish allows the coated substrates to be handled and processed into shapes with very low product loss due to deformation or marring of the surface coating.

Although the invention has been described herein with specific reference to a presently preferred embodiment thereof, it will be appreciated by those skilled in the art that various additions, modifications, deletions, and alterations may be made to such preferred embodiment without departing from the spirit and scope of the invention. Accordingly, it is intended that all reasonably foreseeable additions, modifications, deletions, and alterations be included within the scope of the invention as defined in the following claims.

What is claimed is:

1. A heat conductive composition for transferring heat from a heat-dissipating component to a heat dissipater comprising:
   a) 60% to 90% by weight of paraffin wax;
   b) 10% to 40% by weight of graphite;
   c) an ethylene vinyl acetate polymer in an amount up to 5% by weight; and
   d) a thinning agent in an amount up to 2% by weight wherein said composition melts between 50° to 61° C.

2. The composition of claim 1 wherein said graphite is present in an amount from 20% to 40% by weight of said composition.

3. The composition of claim 1 wherein said graphite is present in an amount of approximately 35% by weight of said composition.

4. The composition of claim 1 wherein a substantial portion of the graphite consists of generally spherical particles having a diameter equal to or less than 6 microns.

5. A method for facilitating transferring heat from a heat-dissipating component to a heat dissipater thereof comprising the steps of
   a) providing a heat conductive compound containing:
      i) 10% to 40% by weight of graphite;
      ii) 60% to 90% by weight of paraffin wax having a melting temperature of 51° C.;
      iii) an ethylene vinyl acetate polymer in an amount up to 5% by weight; and
   iv) a thinning agent in an amount up to 2% by weight; wherein said heat conductive compound melts between 50° to 61° C.
   b) interposing said heat conductive compound between said heat-dissipating component and said heat dissipater.

6. The method of claim 5 wherein in step b), said heat conductive composition is interposed by rubbing said composition at the interface between said heat-dissipating component and said heat dissipater.

7. The method of claim 5 wherein in step b), said heat conductive composition is interposed by coating the interface between said heat-dissipating component and said heat dissipating with said composition, said composition having been applied upon said interface by means of a coating rod.

8. The method of claim 5 wherein step b) comprises the steps of liquefying said heat conductive composition and depositing said liquified heat conductive composition upon said interface between said heat-dissipating component and said heat dissipater.

9. The method of claim 8 wherein in step b), said heat conductive composition is liquified by heating.

10. The method of claim 5 wherein in step b), said heat conductive compound is applied as a layer between said between said heat-dissipating component and said heat dissipater, said layer of heat conductive compound having a thickness from 0.5 to 1 mil.

* * * * *